(12) United States Patent
Kanatzidis et al.

(10) Patent No.: US 11,531,124 B2
(45) Date of Patent: Dec. 20, 2022

(54) INORGANIC TERNARY HALIDE SEMICONDUCTORS FOR HARD RADIATION DETECTION

(71) Applicant: NORTHWESTERN UNIVERSITY, Evanston, IL (US)

(72) Inventors: Mercouri G. Kanatzidis, Wilmette, IL (US); Bruce W. Wessels, Wilmette, IL (US); Zhifu Liu, Wilmette, IL (US); Wenwen Lin, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 432 days.

(21) Appl. No.: 16/318,254

(22) PCT Filed: Jul. 21, 2017

(86) PCT No.: PCT/US2017/043193
§ 371 (c)(1),
(2) Date: Jan. 16, 2019

(87) PCT Pub. No.: WO2018/017909
PCT Pub. Date: Jan. 25, 2018

(65) Prior Publication Data
US 2019/0235096 A1    Aug. 1, 2019

Related U.S. Application Data

(60) Provisional application No. 62/365,165, filed on Jul. 21, 2016.

(51) Int. Cl.
*H01L 27/146* (2006.01)
*G01T 1/24* (2006.01)
(Continued)

(52) U.S. Cl.
CPC ............ *G01T 1/241* (2013.01); *G01T 1/24* (2013.01); *H01L 31/0264* (2013.01); *H01L 31/085* (2013.01)

(58) Field of Classification Search
CPC ......... G01T 1/241; G01T 1/24; G01T 1/2928; G01T 1/20; H01L 31/0264; H01L 31/085
See application file for complete search history.

(56) References Cited

U.S. PATENT DOCUMENTS 454,778 A    6/1891    Swartz
2,676,096 A    4/1954    Emert et al.
(Continued)

FOREIGN PATENT DOCUMENTS

WO    WO 2018/039583 A1    3/2018

OTHER PUBLICATIONS

Maino et al., 2014, downloaded from inforum.in.ua, pp. 95-97. (Year: 2014).*

(Continued)

*Primary Examiner* — Kiho Kim
(74) *Attorney, Agent, or Firm* — Bell & Manning, LLC (57) ABSTRACT

Methods and devices for detecting incident radiation, such as incident X-rays, gamma-rays, and/or alpha particle radiation are provided. The methods and devices use high purity, high quality single-crystals of inorganic semiconductor compounds, including solid solutions, having the formula $AB_2X_5$, where A represents Tl or In, B represents Sn or Pb, and X represents Br or I, as photoelectric materials.

6 Claims, 5 Drawing Sheets

(51) Int. Cl.
  H01L 31/08      (2006.01)
  H01L 31/0264    (2006.01)

(56) References Cited

U.S. PATENT DOCUMENTS

| | | | |
|---|---|---|---|
| 3,023,080 A | 2/1962 | Kulifay | |
| 4,775,425 A | 10/1988 | Guha et al. | |
| 5,513,834 A | 5/1996 | Feldewerth et al. | |
| 2010/0187429 A1* | 7/2010 | Engel | G01T 1/2928 250/370.09 |
| 2012/0153178 A1* | 6/2012 | Kanatzidis | H01L 31/085 250/370.12 |

OTHER PUBLICATIONS

Androulakis et al., "Dimensional reduction: A design tool for new radiation detection materials," Adv. Mater., 2011, vol. 23, pp. 4163-4167.

Beck et al., "A Study on $AB_2X_5$ Compounds (A: K, In, Tl; B: Sr, Sn, Pb; X: Cl, Br, I)," Z. Anorg. Allg. Chem., 1986, vol. 536, pp. 35-44.

H. P. Beck, "A Study on $AB_2X_5$ Compounds. II [1] Refinement of the Structures of $InSn_2Br_5$ and $InSn_2I_5$," Z. Anorg. Allg. Chem., 1986, vol. 536, pp. 45-52.

Becker et al., "A High-Pressure Study on NH4PB2Br5 type Compounds Part II: Electronic Structure and Changes under High Pressure," Z. Anorg. Allg. Chem., 2005, vol. 631, pp. 141-147.

Churbanov, et al., "Behavior of Impurity Inclusions during Vacuum Distillation of Tellurium," Inorganic Materials, 2001, vol. 37, No. 10, pp. 1017-1020.

Clark et al., "Polarization-selective three-photon absorption and subsequent photoluminescence in $CsPbBr_3$ single crystal at room temperature," Physical Review B: Condens. Matter Mater. Phys., 2016 vol. 93, pp. 195202-1-195202-8.

Mercouri Kanatzidis, "Novel Chalcogenide Materials for x-ray and γ-ray Detection," Defense Threat Reduction Agency Technical Report (DTRA-TR-16-53), May 2016, pp. 1-63.

Im et al., "Formation of native defects in the y-ray detector material $Cs_2Hg_6S_7$," Applied Physics Letters, 2012, vol. 101, pp. 202103-202103-4.

Johnsen et al., "Thallium Chalcogenide-Based Wide-Band-Gap Semiconductors: $TlGaSe_2$ for Radiation Detectors," Chem. Mater., 2011, vol. 23, pp. 3120-3128.

M. Kocsis, "Proposal for a New Room Temperature X-ray Detector-Thallium Lead Iodide," IEEE Transactions on Nuclear Science, Dec. 2000, vol. 47, No. 6, pp. 1945-1947.

Kostina et al., "Photoluminescence Fatigue and Inhomogeneous Line Broadening in Semi-Insulating $Tl_6SeI_4$ Single Crystals," Semicond. Sci. Technol., 2016, vol. 31, pp. 1-28.

Li et al., "Crystal Growth and Characterization of the X-ray and γ-ray Detector Material $Cs_2Hg_6S_7$," Crystal Growth & Design, 2012, vol. 12, pp. 3250-3256.

Li et al., "Investigation of Semi-Insulating $Cs_2Hg_6S_7$ and $Cs_2Hg_{6-x}Cd_xS_7$ Alloy for Hard Radiation Detection," Crystal Growth & Design, 2014, vol. 14, pp. 5949-5956.

Lin et al., "$TlSn_2I_5$, a Robust Halide Antiperovskite Semiconductor for γ-Ray Detection at Room Temperature," ACS Photonics, 2017, vol. 4, pp. 1805-1813.

Proceedings vol. 9968, Hard X-Ray, Gamma-Ray, and Neutron Detector Physics XVIII; 99681A (2016), SPIE Optical Engineering + Applications, 2016, San Diego, California, United States.

Liu et al., "Photo-Induced Current Transient Spectroscopy of Semi-insulating Single Crystal $Cs_2Hg_6S_7$," Journal of Electronic Materials, 2015, vol. 44, No. 1, pp. 222-226.

Nguyen et al., "Photoconductivity in $Tl_6SI_4$: A Novel Semiconductor for Hard Radiation Detection," Chemistry of Materials, 2013, vol. 25, pp. 2868-2877.

Peters, et al., "Investigation of Defect Levels in $Cs_2Hg_6S_7$ Single Crystals by Photoconductivity and Photoluminescence Spectroscopies," Journal of Applied Physics, 2012, vol. 112, pp. 063702-1-063702-06.

Stoumpos et al., "Crystal Growth of the Perovskite Semiconductor $CsPbBr_3$: A New Material for High-Energy Radiation Detection," Crystal Growth & Design, 2013, vol. 13, pp. 2722-2727.

Wang et al., "Hard Radiation Detection from the Selenophosphate $Pb_2P_2Se_6$," Advanced Functional Materials, 2015, vol. 25, pp. 4874-4881.

Wang et al., "Refined Synthesis and Crystal Growth of $Pb_2P_2Se_6$ for Hard Radiation Detectors," Crystal Growth & Design, 2016, vol. 16, pp. 5100-5109.

Wibowo et al., "Photoconductivity in the Chalcohalide Semiconductor, SbSeI: a New Candidate for Hard Radiation Detection," Inorganic Chemistry, 2013, vol. 52, pp. 7045-7050.

International Search Report and Written Opinion dated Feb. 14, 2018 for International application No. PCT/US17/43193.

* cited by examiner

INORGANIC TERNARY HALIDE SEMICONDUCTORS FOR HARD RADIATION DETECTION

CROSS-REFERENCE TO RELATED APPLICATIONS

The present application is a National Stage of International Application No. PCT/US2017/043193, filed on Jul. 21, 2017, the entire contents of which are hereby incorporated by reference; which claims priority to U.S. provisional patent application No. 62/365,165 that was filed on Jul. 21, 2016, the entire contents of which are hereby incorporated by reference.

REFERENCE TO GOVERNMENT RIGHTS

This invention was made with government support under DE-NA0002522 awarded by the Department of Energy. The government has certain rights in the invention.

BACKGROUND

Compound semiconductors are highly interesting for room-temperature radiation detection applications, including homeland security, medical scanning, and dirty bomb scanning. However, only a handful of compounds have been identified as potential hard radiation detector materials, as a set of strict physical property requirements must be simultaneously satisfied to yield X-ray and γ-ray responses. Even the commercialized room temperature detector, $Cd_{0.9}Zn_{0.1}Te$ (CZT), still suffers from growth and fabrication problems related to its intrinsic defects. (See, Szeles, C., *IEEE T Nucl Sci* 2004, 51 (3), 1242-1249; and Milbrath, B. D., et al., *J Mater Res* 2008, 23 (10), 2561-2581.) TlBr is another kind of high mobility-lifetime (μτ) (electron: ~$10^{-3}$ $cm^2/V$) detection material with a high energy resolution of 2.4% at 662 KeV Gamma-rays. (See, Churilov, A. V., et al., *IEEE T Nucl Sci* 2009, 56 (4), 1875-1881; Churilov, A. V., et al., *J Cryst Growth* 2010, 312 (8), 1221-1227; Churilov, A. V., et al., *Hard X-Ray, Gamma-Ray, and Neutron Detector Physics X* 2008, 7079; and Kim, H., et al., IEEE *T Nucl Sci* 2009, 56 (3), 819-823.) However, TlBr is subject to polarization-induced instability at room temperature operation. (See, Hitomi, K.; Shoji, T.; Ishii, K., *J Cryst Growth* 2013, 379, 93-98.)

SUMMARY

Methods and devices for detecting incident particle radiation or electromagnetic radiation, such as incident X-rays, gamma-rays, and/or alpha particle radiation are provided. The devices include photodetectors, including photodiodes.

One embodiment of a method for the detection of gamma, X-ray radiation, and/or alpha particle radiation, comprises the steps of: exposing a material comprising an inorganic semiconductor having the formula $AB_2X_5$, where A represents Tl or In, B represents Sn or Pb, and X represents Br or I, to incident gamma radiation, X-ray radiation, alpha particle radiation, or a combination thereof, wherein the material absorbs the incident radiation and electron-hole pairs are generated in the material; and measuring at least one of the energy or intensity of the absorbed incident radiation by detecting the generated electrons and/or holes.

One embodiment of a detector for gamma, X-ray radiation, and/or alpha particle radiation comprises: a material comprising an inorganic semiconductor having the formula $AB_2X_5$, where A represents Tl or In, B represents Sn or Pb, and X represents Br or I; a first electrode in electrical communication with the material; a second electrode in electrical communication with the material, wherein the first and second electrodes are configured to apply an electric field across the material; and a detector configured to measure a signal generated by electron-hole pairs that are formed when the material is exposed to incident gamma radiation, x-ray radiation, alpha particle radiation, or a combination thereof.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Methods and devices for detecting incident radiation, such as incident X-rays or gamma-rays, and/or alpha particles, are provided. The methods and devices use high-purity, high-quality single crystals of inorganic semiconductor compounds having the formula $AB_2X_5$, where A represents Tl or In, B represents Sn or Pb, and X represents Br or I, as photoelectric materials to convert the incident radiation into an electric signal. The devices include optoelectronic and photonic devices, such as photodetectors and photodiodes. The formula $AB_2X_5$ covers solid solutions that include both A elements, both B elements, and/or both X elements, as well as the end members of the formula. For the solid solutions, the formula can be written as $(Tl, In)(Sn, Pb)_2(I, Br)_5$. Thus, the formula covers the compounds $TlSn_2I_5$, $InSn_2I_5$, $TlSn_2Br_5$, $TlPb_2I_5$, $TlPb_2Br_5$, $InSn_2Br_5$, $InPb_2I_5$, and $InPb_2Br_5$, as well as the solid solutions $Tl_{1-x}In_xSn_{2-y}Pb_yI_{5-z}Br_z$, $In_{1-x}Tl_xSn_{2-y}Pb_yI_{5-z}Br_z$, $Tl_{1-x}In_xSn_{2-y}Pb_yBr_{5-z}I_z$, $Tl_{1-x}In_xPb_{2-y}Sn_yI_{5-z}Br_z$, $Tl_{1-x}In_xPb_{2-y}Sn_yBr_{5-z}I_z$, $In_{1-x}Tl_xSn_{2-y}Pb_yBr_{5-z}I_z$, $In_{1-x}Tl_xPb_{2-y}Sn_yI_{5-z}Br_z$, and $In_{1-x}Tl_xPb_{2-y}Sn_yBr_{5-z}I_z$, where $0 \leq x \leq 0.5$; $0 \leq y \leq 1$; and $0 \leq x \leq 0.25$ and at least one of x, y, and z is >0.

The compounds desirably have a band gap of at least 1.5 eV. This includes compounds having a band gap of at least 1.8 eV, and further includes compounds having a bandgap of at least 2.0 eV. For example, in some embodiments the compounds have a band gap in the range from about 1.6 eV to about 3 eV. Methods of determining the bandgap of a material are described in the Example.

Detector-grade materials comprising the semiconductor compounds can be grown with high chemical purity and high crystal quality. The compounds are stable in air. Methods of making detector-grade materials using a Bridgman method are demonstrated in the Examples below, using $TlSn_2I_5$ as an illustration. The methods described in the Examples can be adapted to make detector-grade materials comprising the other inorganic semiconductor compounds having the formula $AB_2X_5$, including $InSn_2I_5$, $TlSn_2Br_5$, $InSn_2Br_5$, $TlPb_2I_5$, $TlPb_2Br_5$. Moreover, crystals can be grown using other methods, including various flux methods, solution methods, and vapor transport methods. These include the Czochralski method, top seeded flux methods, optical floating zone methods, temperature cooling solution methods, solvent evaporation solution methods, physical or chemical vapor transport methods, and the like.

The high-quality, low-impurity nature of the compounds is reflected in their high electrical resistivities. For example, some embodiments of the compounds have an electrical resistivity at 23° C. of at least $10^9$ Ω·cm. This includes compounds having an electrical resistivity at 23° C. of at least $10^{10}$ Ω·cm, and further includes compounds having an electrical resistivity at 23° C. of at least $10^{11}$ Ω·cm. Methods of determining the electrical resistivity of a material are described in the Example.

Figure 1A:
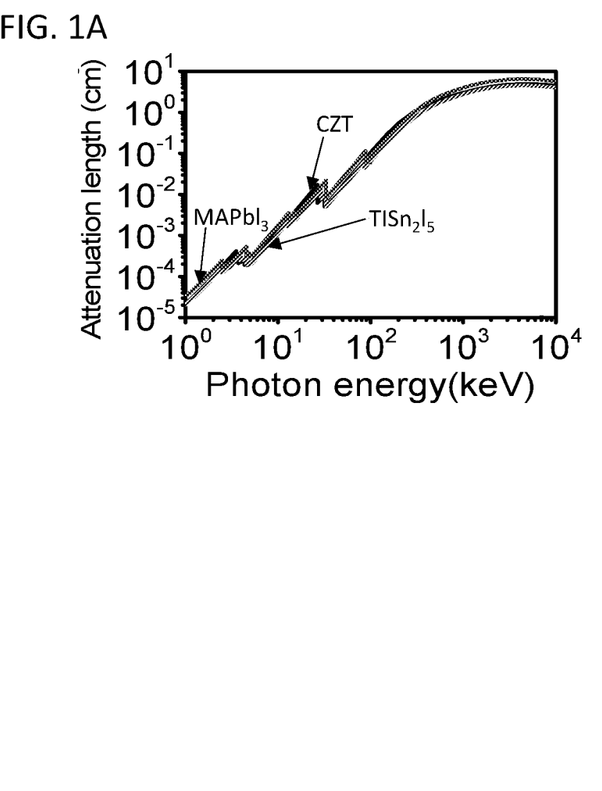
FIG. 1A depicts estimated attenuation length as a function of incident photon energy in $TlSn_2I_5$, $Cd_{0.9}Zn_{0.1}Te$ and $CH_3NH_3PbI_3$.
Figure 1B:
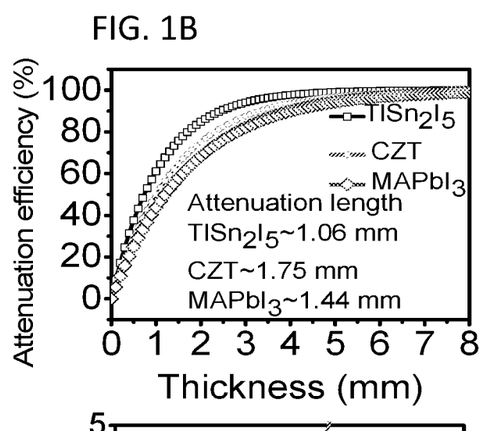
FIG. 1B shows estimated attenuation efficiency as a function of thickness in $TlSn_2I_5$, $Cd_{0.9}Zn_{0.1}Te$ and $CH_3NH_3PbI_3$ to 122 keV γ-ray from $^{57}Co$

$TlSn_2I_5$ crystallizes in the tetragonal I4/mcm space group, with $\alpha=8.8019(5)$ Å, $c=15.2514(11)$ Å, $V=1181.58(13)$ Å$^3$, and a calculated density of 6.02 g/cm$^3$. This compound has a high atomic number (Tl:81, Sn:50, I:53) and high density. It has a photon stopping power even higher than CZT (FIG. 1A and FIG. 1B). It has a bandgap of 2.14 eV, suggesting low intrinsic carrier concentration, and accordingly permits low dark current for operation at room temperature (~23° C.). In addition, this compound congruently melts at a very low temperature (315° C.) and has no destructive phase transition in the temperature range of its melting point and room temperature. (See, Beck, H. P., et al. A study on $AB_2X_5$ compounds (A-K, In, Tl, B—Sr, Sn, Pb, X—Cl, Br, I). *Z Anorg Allg Chem* 1986, 536 (5), 35-44.) This feature renders this compound suitable for purification and growth technologies that grow single crystals with a lower defect density. Apart from the above features, this compound forms crystal with a Vickers Hardness of 75, providing robust mechanical properties for device fabrication and operation. Therefore, this compound is a suitable detector material which can be an alternative to some common detector materials, such as CZT, TlBr, and $HgI_2$.

One aspect of the invention provides devices for the detection of incident radiation. In some embodiments the devices comprise: a material comprising an inorganic compound, of the type described herein, wherein the material is capable of absorbing incident radiation and generating electron-hole pairs; a first electrode in electrical communication with the material; and a second electrode in electrical communication with the material. In such devices the first and second electrodes are configured to apply an electric field across the material. The first and second electrodes can be disposed on opposing surfaces of the photoactive material. For example, the device can have a vertical structure in which a first electrode is on a top surface of a layer of the photoactive material and a second electrode in on an oppositely facing bottom surface of the layer of the photoactive material. When incident radiation is absorbed by the photoactive material, electron-hole pairs are formed in the material and a photocurrent is generated. The devices can further comprise one or more additional electronic components configured to measure a signal generated by the electron-hole pairs that form upon exposure of the material to the incident radiation. The incident radiation can comprise particle radiation, such as alpha particle radiation or electromagnetic radiation, such as gamma radiation (i.e., wavelengths in the range from about $1 \times 10^{-10}$ to about $2 \times 10^{-13}$ meters) and/or x-ray radiation (i.e., wavelengths in the range from about 0.01 to 10 nanometers). Some embodiments of the detectors are operable at room temperature (e.g., at temperature in the range from about 20° C. to about 26° C.).

Radiation detectors incorporating the inorganic semiconductor compounds having the formula $AB_2X_5$ are characterized by high electron mobilities ($\mu_e$), including electron mobilities greater than 65 cm$^2$ V$^{-1}$ s$^{-1}$, and further including electron mobilities greater than 70 cm$^2$ V$^{-1}$ s$^{-1}$ and greater than 90 cm$^2$ V$^{-1}$ s$^{-1}$. Methods of determining the electron mobilities of a radiation detector are described in the Example.

EXAMPLE

This example describes $TlSn_2I_5$, an inorganic iodide semiconductor with two-dimensional (2D) crystal structure and an anti-perovskite topology. $TlSn_2I_5$ features elements of high atomic number (Tl:81, Sn:50, I:53) and high density (6.05 g·cm$^{-3}$) that guarantee a superior absorption coefficient relative to both halide perovskites and CZT against hard radiation, as shown in FIGS. 1A and 1B. (See, Seltzer, S. M. Calculation of photon mass energy-transfer and mass energy-absorption coefficients. *Radiat. Res.* 1993, 136, 147-170.) $TlSn_2I_5$ is a brick-red compound with a desirable wide bandgap of $E_g$=2.14 eV that melts congruently at a low temperature (315° C.), which allows for simple purification/crystal growth protocols and a low-concentration of thermally activated defects. The compound has no phase transitions between its melting and ambient temperature and is stable in air. Large crystals of $TlSn_2I_5$ were grown from the melt by the vertical Bridgman method, yielding single-crystalline ingots which can be subsequently processed to fabricate detectors. (See, Bridgman, P. W. Certain physical properties of single crystals of tungsten, antimony, bismuth, tellurium, cadmium, zinc, and tin. *Proc. Am. Acad. Arts. Sci.* 1925, 60, 305-383.) The compound has a very high resistivity of $4 \times 10^{10}$ $\Omega \cdot cm$ and exhibits no signs of electrical polarization, thus being suitable for fabrication of detectors with low background dark current. $TlSn_2I_5$ detectors are photoresponsive to hard X-rays, γ-rays and α-particles, showing an electron mobility-lifetime product, $\mu_e\tau_e=1.1\times 10^{-3}$ $cm^2 \cdot V^{-1}$ and $\mu_e\tau_e=4.5\times 10^{-5}$ $cm^2 \cdot V^{-1}$ for high-flux X-rays and low-flux γ-rays, respectively. Drift mobility measurements using α-particles reveal an electron mobility $\mu_e=94\pm 16$ $cm^2 \cdot V^{-1} \cdot s^{-1}$. The detector performance of $TlSn_2I_5$ shows long-term stability under constant applied bias without suffering any polarization effects.

Results and Discussion

Figure 1C:
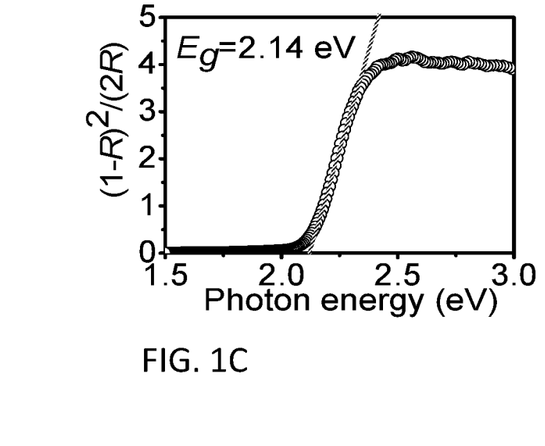
FIG. 1C shows the UV-vis-Near IR optical absorption spectrum of $TlSn_2I_5$.

Crystal Growth and Characterization. Bulk $TlSn_2I_5$ was prepared by a stoichiometric direct combination of the Sn and $I_2$ elements and a TlI precursor. The obtained raw compound was then used to grow single crystals using the vertical Bridgman method. The as-grown crystal was phase pure, as evidenced by powder X-ray diffraction on a powdered ingot specimen. The whole crystal ingot had a brick-red color and was optically transparent with no visible cracks. The absence of cracks suggested that the crystal could endure the large temperature gradient of 23° $C \cdot cm^{-1}$ during growth. A crystal chunk with a naturally cleaved mirror-like surface, which was parallel to the growth direction, was produced. X-ray diffraction on the cleaved crystal facet showed two diffraction peaks, which matched well with the (002) and (006) peaks of the simulated pattern at 2 θ=11.595° and 2 θ=35.280°, respectively, suggesting that the cleaved surface consisted of (001) planes that oriented perpendicular to the growth direction. The performance of hard radiation detection materials strongly depends on the defect density, as defects can act as shallow impurity levels, trapping centers or scattering centers. Optical spectroscopy can provide useful insights into the defect states, and thus the absorption spectrum of $TlSn_2I_5$ was measured. FIG. 1C shows the optical absorption spectrum of $TlSn_2I_5$, indicating a bandgap of $E_g=2.14$ eV, consistent with the brick-red color of the crystal. The bandgap was large enough to suppress the formation of thermally activated charge carriers, yet sufficiently narrow to generate photoinduced electron-hole pairs due to a lower pair creation energy.

$TlSn_2I_5$ melts congruently at 314° C. and is free of phase transitions between melting and ambient temperatures. Its low melting point is beneficial to suppress formation of thermally activated defects, which in turn can enhance its detection performance. The compound is environmentally stable, and mechanically robust as shown from Vickers hardness measurements. The Vickers hardness of polished $TlSn_2I_5$ is 75±3.0 $kg \cdot mm^{-2}$ on the (001) plane, which is significantly higher than that of $CH_3NH_3PbI_3$ (22±0.9 $kg \cdot mm^{-2}$).

Crystal Structure. $TlSn_2I_5$ adopts the $(NH_4)Pb_2Br_5$ structure type, crystallizing in the tetragonal I4/mcm space group, with α=8.8019(5) Å, c=15.2514(11) Å, V=1181.58(13) $Å^3$, with a calculated density of 6.05 $g \cdot cm^{-3}$. FIGS. 2A, 2B, 2C, 2D, 2D, and 2F show the crystal structure of $TlSn_2I_5$. The compound has two-dimensional (2D) "infinite" $(Sn_2I_5)^-$ layers, with the $Tl^+$ ions occupying the interlayer voids.

Figures 2A, 2B:
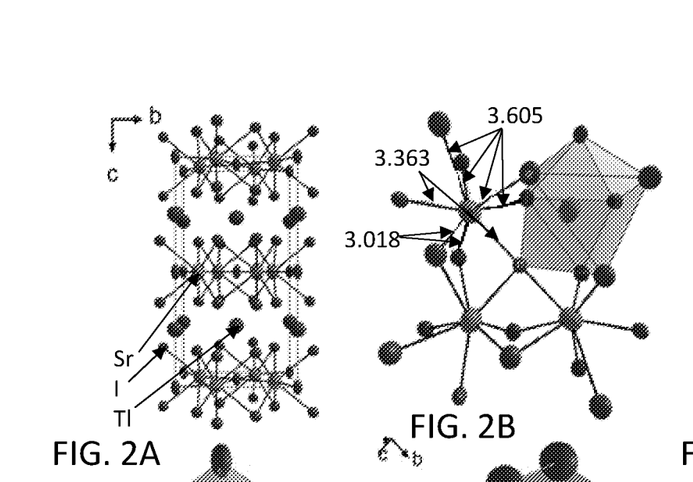
FIG. 2A shows a view of the unit cell along the ab crystallographic plane.
FIG. 2B depicts the building block of the $\{Sn_2I_5\}^-$ layers indicating the Sn—I bond lengths.
Figure 2C:
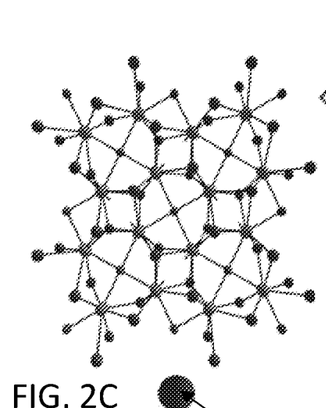
FIG. 2C shows an extended view of the $\{Sn_2I_5\}^-$ layers emphasizing on the connectivity of the planar $\{ISn_4\}^{7+}$ units. The arrows indicate the most likely location of the lone pair.
Figure 2D:
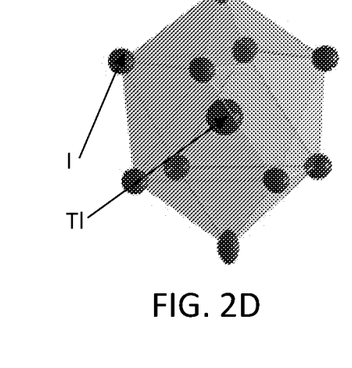
FIG. 2D shows the coordination of the polyhedral of Tl(1).
Figure 2E:
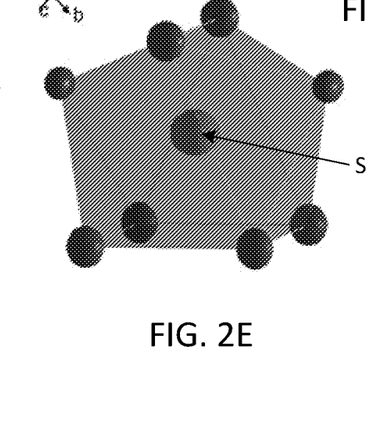
FIG. 2E shows the coordination of the polyhedral of Sn(1).
Figure 2F:
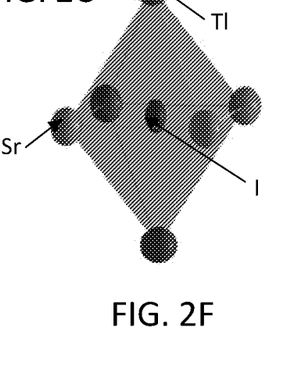
FIG. 2F shows the coordination of the polyhedral of I(1).
Figure 2G:
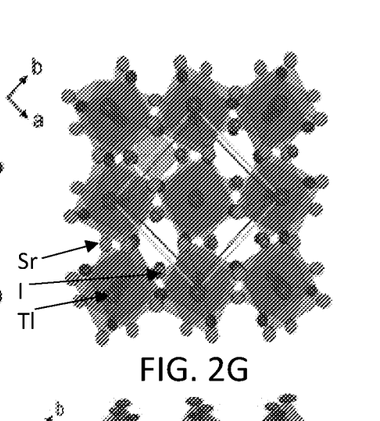
FIG. 2G shows a comparison between the anti-perovskite topology of $TlSn_2I_5$ and FIG. 2H.
Figure 2H:
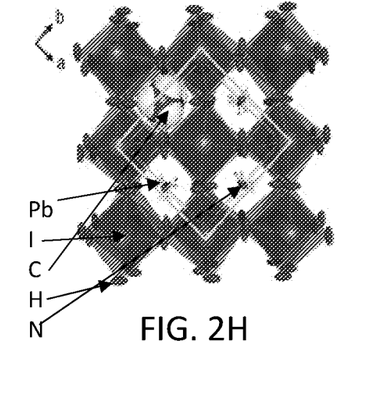
FIG. 2H shows the perovskite topology of the hybrid inorganic-organic perovskite $CH_3NH_3PbI_3$. The lattice of the $TlSn_2I_5$ is significantly more distorted than that of $CH_3NH_3PbI_3$.

When viewed without chemical bonding restrictions, the lattice formed between I(1), Tl(1) and Sn(1) adopted an anti-perovskite structure, with I being in the center of an axially elongated octahedron with its equatorial plane occupied by four Sn ions and its polar positions by two Tl ions to form an cationic $[ISn_2Tl]^{4+}$ framework (FIGS. 2G and 2H). Four of the "ignored" iodide ions (I(2)) occupy the perovskite cavity, forming "dangling bonds" within the hollow cavity (chemically these are still bonded to Sn(1)) assembling a nearly regular $\{I_4\}^{4-}$ tetrahedron. The framework has a distorted perovskite structure, with the octahedra tilting out-of-phase.

Figure 3A:
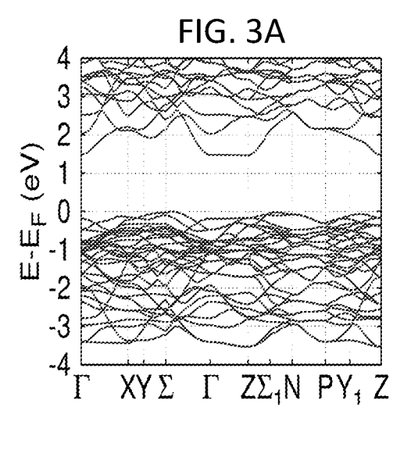
FIG. 3A depicts the electronic band structure of $TlSn_2I_5$.
Figures 3B, 3C:
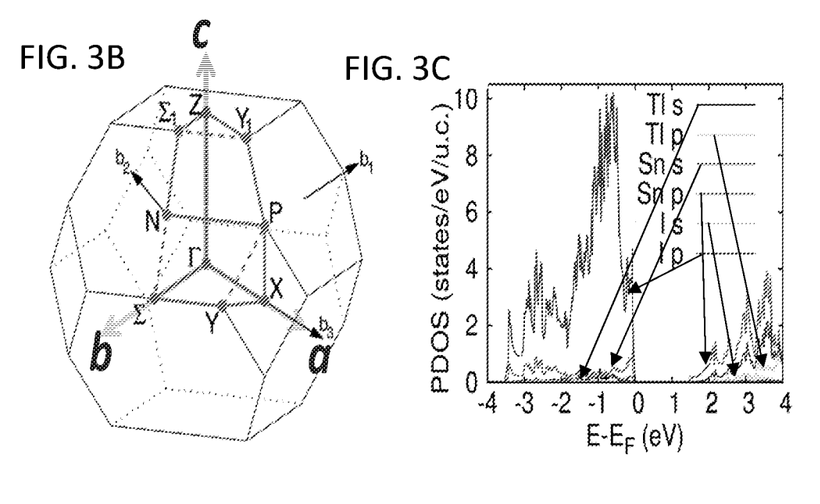
FIG. 3B shows a view of first Brillouin zone in reciprocal space showing the principle directions and points in comparison with real space.
FIG. 3C depicts the projected electronic density of states of $TlSn_2I_5$. The Fermi level ($E_F$) is set to zero energy.

Electronic Band Structure. The calculated electronic band structure is shown in FIG. 3A plotted along the lines between the high-symmetry points in the Brillouin zone. FIG. 3B shows the first Brillouin zone in reciprocal space, showing the principle directions and points. The electronic density of states (DOS) projected onto the atomic sites are shown in FIG. 3C. The band structure shows that $TlSn_2I_5$ has an indirect band gap. The primary valence band (VB) maximum (VBM) is located on the line between Γ F and Σ points (close to Σ point), and the conduction band (CB) minimum (CBM) is located at Z point. Interestingly, there is a secondary VBM located on the line between the N and $\Sigma_1$ points (close to $\Sigma_1$), which is only 0.02 eV lower in energy than the main VBM. Similarly, a secondary CBM, which is just 0.01 eV higher than the primary CBM, is at the Γ point. CBM is very anisotropic: CB is almost flat in the Γ-Z direction, and highly dispersive in other directions (Z-$\Sigma_1$, Z-$Y_1$), suggesting that there is no electronic communication between the layers. Such behavior translates into highly anisotropic effective masses: the calculated principle electron effective masses were as follows: $m_{e,xx}=0.21$ $m_0$, $m_{e,yy}=0.21$ $m_0$, and $m_{e,zz}=21.5$ $m_0$. This result demonstrates that for properly oriented crystals, a high μτ value for electrons can be achieved. If the applied electric field were along the ab plane, which is parallel to the cleaved (001) planes, a higher μτ value could be achieved for a detector made of $TlSn_2I_5$. The VBM would be flatter and the calculated values of hole effective masses would be $m_{h,xx}=0.50$ $m_0$, $m_{h,yy}$1.2 $m_0$, $m_{e,zz}$1.9 $m_0$; therefore, hole mobility would be expected to be lower. The high anisotropy of both band extrema is due to the layered, 2D structure of the $TlSn_2I_5$ compound.

The PDOS calculations indicate that the VBM was composed of I p and Sn s orbitals which, however, were not strongly coupled. The CBM has mainly pure Sn p character in the Γ-Z direction of the flat band, but changes to the strongly coupled Sn p-I p orbital character in other directions. The lone pairs of Sn p orbitals led to the localized character of CBM along the Γ-Z line, while the hybridization between Sn p and I p orbitals was responsible for the highly dispersive character of the CBM in other directions. Tl atoms did not contribute to electronic states near the band edges.

Figure 4A:
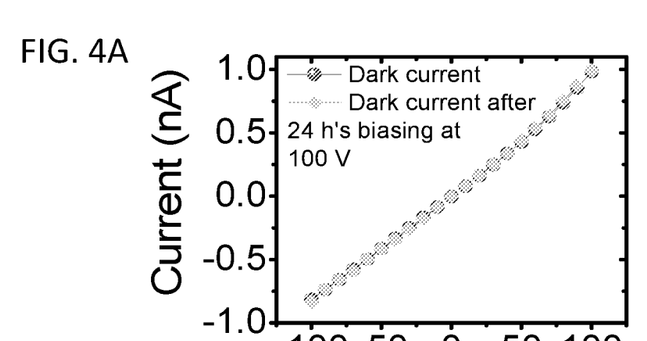
FIG. 4A depicts I-V characteristics of a $TlSn_2I_5$ detector.
Figure 4B:
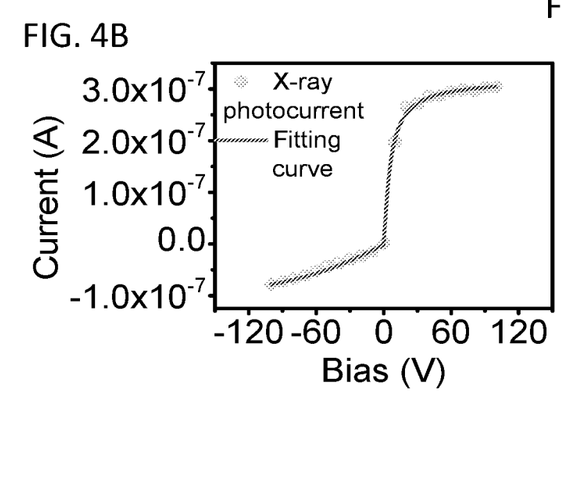
FIG. 4B shows the photocurrent response to 22 keV Ag X-rays at various biases and μτ derived from X-ray photocurrent measurements using single-carrier Hecht equation.
Figure 4C:
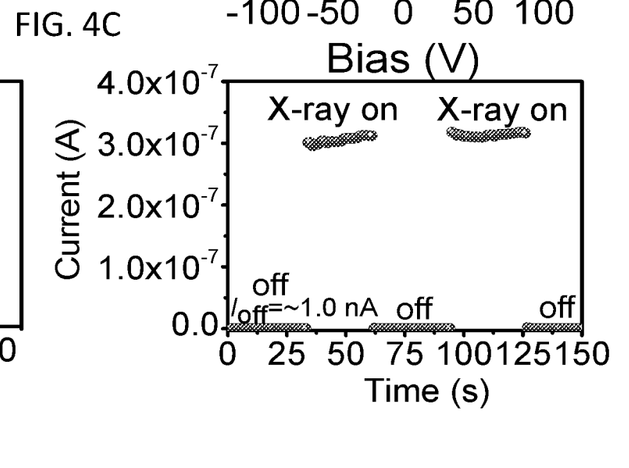
FIG. 4C depicts the photocurrent response to Ag X-rays by switching the X-ray source on and off at a bias of 100 V.

Charge Transport and Detector Performance. The dark current of the detector made from $TlSn_2I_5$ wafers was measured. A typical detector was made from a 1 mm thick $TlSn_2I_5$ wafer with a carbon electrode of ~2 mm in diameter. The orientation of $TlSn_2I_5$ crystal was perpendicular to the cleaved (001) planes, thus the electric field of detector was along the ab plane. According to the calculations on the effective electron masses along different directions, the present direction of electric field was preferred for obtaining a better charge collection efficiency. As shown in FIG. 4A, the I-V curve of the detector was linear in the range of ±100 V, indicating the absence of space charge. The resistivity estimated from the I-V curve was $4.0 \times 10^{10}$ $\Omega \cdot cm$, demonstrating the ability of this material to provide a high signal-to-noise ratio. The high resistivity did not degrade after 24 h of biasing at 100 V, indicating high stability against ionic movement. The photoresponse of the detector to a Ag Kα source (22 keV) X-ray source is demonstrated in FIG. 4B. The photocurrent at various biases was at least two orders of magnitude higher than the dark current, indicating that this material is responsive to X-rays. In order to assess the quality of the detector, the mobility-lifetime products for electrons and holes were estimated using the Hecht equation, based on X-ray photocurrent measurements (see Methods). (See, Hecht, K. Zum Mechanismus des lichtelektrischen primärstromes in isolierenden kristallen. *Z. Phys.* 1932, 77, 235-245.) The electron mobility-lifetime product $\mu_e\tau_e$ ($1.1\times10^{-3}$ $cm^2 \cdot V^{-1}$) was 14 times higher than that of the holes $\mu_h\tau_h$ ($7.2\times10^{-5}$ $cm^2 \cdot V^{-1}$). The great disparity in $\mu\tau$ values agreed well with the great difference between the calculated effective electron masses and hole masses. FIG. 4C illustrates the photoresponse to Ag X-rays at 100 V applied bias, exhibiting high contrast and spontaneous response between the beam on and off states. The X-ray photoresponse for electrons in $TlSn_2I_5$ represents a good measure of the expected device performance.

Figure 5A:
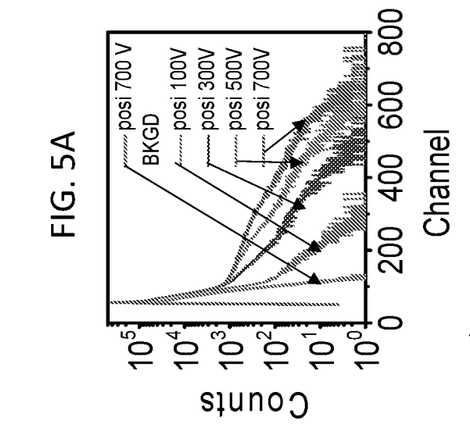
FIG. 5A depicts the 122 keV γ-ray spectral responses of a $^{57}Co$ source at various applied voltages. The curve "700V posi BKGD" refers to the background of energy spectrum at 700 V.
Figure 5B:
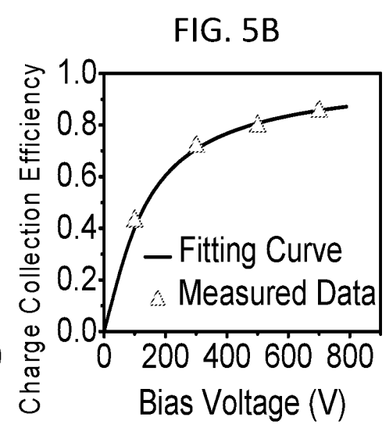
FIG. 5B depicts a $\mu_e\tau_e$ estimation based on 122 keV γ-ray spectroscopy measurements using Hecht equation.

Having established the high sensitivity of $TlSn_2I_5$ as a hard radiation detector, the detection performance for low flux weak source of γ-rays and α-particles was subsequently tested. FIG. 5A shows the $^{57}Co$ (122 keV) γ-ray spectral response as a function of applied voltage under an electron-collection configuration (cathode irradiation). The detector clearly showed a response to γ-rays as indicated by the significant count rate of the detected photons, which allowed the γ-rays induced signal to be easily distinguished from the background noise. Importantly, the shoulder accompanying the spectral tail shifted to higher energy channels with increasing applied bias voltage, a decisive criterion to confirm that the signal was arising from the γ-ray source rather than artificial effects induced by the high voltage. Despite the clear response of the $TlSn_2I_5$ detector, the characteristic peak of the $^{57}Co$ radiation source could not be resolved. The absence of spectral resolution can be assigned to the insufficiently high carrier collection efficiency due to electron trapping and recombination centers. The effect of the traps can be estimated by γ-ray spectroscopy measurements (see Methods), where the $\mu_e\tau_e$ ($4.5\times10^{-5}$ $cm^2 \cdot V^{-1}$) obtained from the Hecht equation is two orders of magnitude lower than the one obtained from X-ray photocurrent measurements ($1.1\times 10^{-3}$ $cm^2 \cdot V^{-1}$, see above) (FIG. 5B). This is because the X-ray photocurrent measurements were performed under photon flooded conditions, as the estimated generation rate of e-h pairs (around $10^{18}$ $pairs\cdot s^{-1} \cdot cm^{-2}$ at 40 kV X-ray tube voltage and 2 mA tube current) was many orders of magnitude higher than the removal rate of carriers under bias. Therefore, the electronic system was not in thermal equilibrium but in a dynamic equilibrium with the photon field. Subsequently, the flooded electrons filled all the active electron trapping centers, and then deactivate the electron trapping centers. In this case, the deactivation of traps provided a higher $\mu_e\tau_e$ which further indicated the usefulness of this detection material. On the other hand, the γ-ray spectroscopy measurement was performed under a photon poor condition, as the estimated generation rate of e-h pairs (around $10^8$ $pairs\cdot s^{-1} \cdot cm^{-2}$ for 122 keV γ-rays from a 0.2 mCi radiation source) was comparable to the removal rate of carrier under bias. Under these conditions, the electronic system was in thermal equilibrium, allowing for the unfilled electron trap centers to determine the charge transport, thereby reducing the effective electron mobility and lifetime.

Figure 5C:
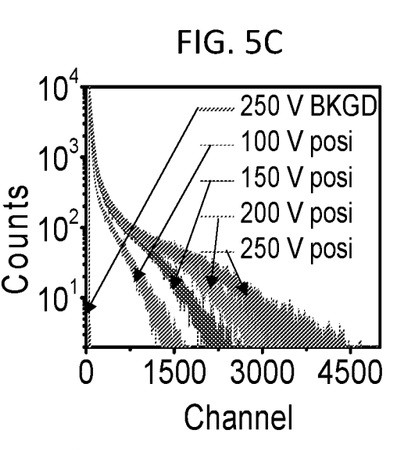
FIG. 5C shows the $^{241}Am$ α-particles' spectral response obtained with a $TlSn_2I_5$ detector.
Figure 5D:
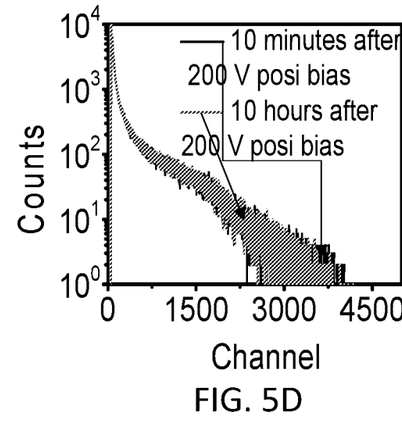
FIG. 5D shows the $^{241}Am$ α-particles' spectral response obtained with a $TlSn_2I_5$ detector at 250 V at different time periods.
Figure 5E:
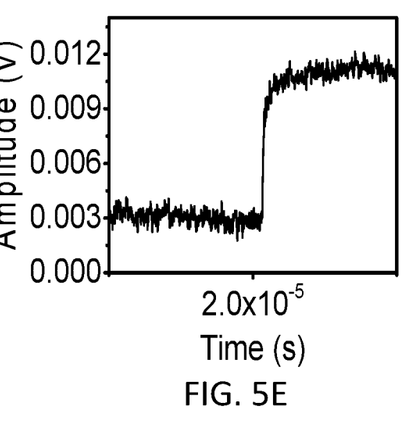
FIG. 5E depicts a typical electron pulse induced by $^{241}Am$ α-particles at 100 V bias for estimating electron rise time.
Figure 5F:
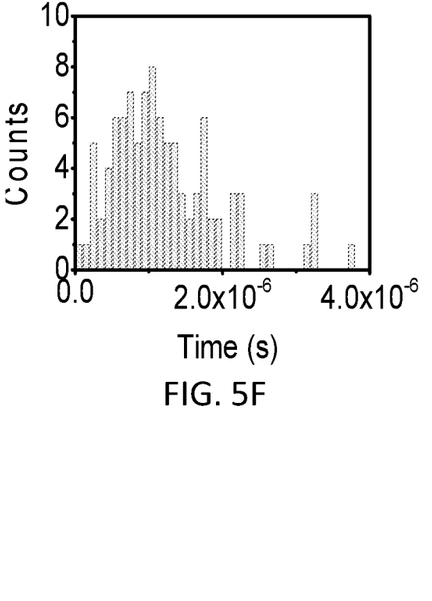
FIG. 5F shows statistics of electron rise times at 100 V bias for a $TlSn_2I_5$ detector from α-particles.

Detection performance was further measured using un-collimated $^{241}Am$ α-particles (5.5 MeV) whose energy was significantly higher than $^{57}Co$, but that were not able to penetrate through the detector. FIG. 5C shows the α-particles spectrum recorded by irradiating the cathode of the $TlSn_2I_5$ detector. The signal clearly indicated that the $TlSn_2I_5$ was photoresponsive to 5.5 MeV α-particles from an un-collimated $^{241}Am$ source with an activity of only ~1 μCi. The detector performance did not degrade after 10 h of biasing at 200 V, indicating the absence of a polarization effect. The electron mobility ($\mu_e$) of $TlSn_2I_5$ detector was estimated by measuring the photoexcited electron drift time ($t_{drift}$) using α-particles from an $^{241}Am$ source. (See, Erickson, J. C., et al. Time of flight experimental studies of CdZnTe radiation detectors. *J. Electron Mater.* 2000, 29, 699-703.) The $\mu_e$ could be estimated by the following equation:

$$\mu_e = \frac{D}{Et_{drift}} \quad (1)$$

where D and E are the detector thickness and the applied electric field, respectively. The electron drift time $t_{drift}$ was measured by recording the electron rise time from the detector output pulse. One hundred measurements of electron rise time were performed and averaged in order to enhance the accuracy of the data. FIG. 5D demonstrates one typical electron output pulse of the $TlSn_2I_5$ detector using α-source from $^{241}Am$. As shown in FIG. 5E, an average value of rise time of 1.06±0.18 μs was calculated at an applied electric field of 1000 V/cm and a detector thickness of 0.1 cm. Since the attenuation length of α-particle in the materials was much smaller than the detector thickness, the electron drift time approximated the electron rise time (FIG. 5F). Based on equation (1), the electron drift mobility of the $TlSn_2I_5$ detector could be estimated to be $\mu_e$=94±16 $cm^2 \cdot V^{-1} \cdot s^{-1}$. Based on the estimated $\mu_e\tau_e$ (~$4.5\times10^{-5}$ $cm^2 \cdot V^{-1}$) and measured $\mu_e$ (94±16 $cm^2 \cdot V^{-1} \cdot s^{-1}$), the lifetime of electron $\tau_e$ under 122 keV γ-ray irradiation condition could be derived to be ~0.47 μs.

Methods

Synthesis and Crystal Growth. The synthesis of $TlSn_2I_5$ polycrystalline raw material was performed by the direct combination of precursors (TlI, 99.999%; Sn, 99.999%; $I_2$, 99.9%; all from Alfa Aesar) in an evacuated silica ampoule at 500° C. for 12 h in a rocking furnace, and then followed by slow cooling to room temperature in 12 h. The TlI raw material was preheated at 80° C. for 12 h to remove surface moisture before synthesis. $TlSn_2I_5$ congruently melts at 315° C. The heating temperature of 500° C. for synthesis can ensure complete melting of $TlSn_2I_5$. The temperature of the furnace was increased slowly to avoid any possibility of explosion due to the high vapor pressure of the $I_2$ precursor. Subsequently, the polycrystalline raw material was put into a conical-tip quartz ampoule with a thickness of 1.5 mm and an inner diameter of 11 mm, which was sealed at a vacuum pressure of $1\times10^{-4}$ mbar. A single crystalline ingot of $TlSn_2I_5$ was grown from stoichiometric melt by the vertical Bridgman method. At the beginning of the growth process, the ampoule was held in the hot zone (520° C.) of a two-zone Bridgman furnace for 12 h to achieve complete melting of polycrystalline raw material. The ampoule was subsequently translated from the hot zone to cold zone at a speed of 0.5 mm/h. In order to generate a temperature gradient of 23° C./cm, the temperature of the cold zone was set at 200° C. After crystal growth, the ingot was annealed in-situ at 250° C. for 24 h in the Bridgman furnace without translation. Finally, the ingot was cooled down to room temperature in 24 h to avoid cracks due to thermal stress. The ingot could easily slide out from the ampoule, indicating that the raw material did not contain oxidation impurities which could react with the silica ampoule. Warning: Due to the toxicity of Tl, great care should be exerted with appropriate protective equipment in both the synthesis and handling of Tl containing precursors and TlSn$_2$I$_5$ single crystals.

Crystal Processing and Characterization. The Boule was cut along the direction perpendicular to the growth direction using a diamond saw. One wafer was extracted from the tip section of the ingot. Subsequently, the sample was polished with silicon carbide sand paper and alumina slurries with a particle size of 0.05-1 µm. After fine polishing with slurries, no further surface etching or passivation were performed on the polished surface. In order to analyze phase purity of as-grown crystal, the PXRD pattern of the ground crystals was collected using an Si-calibrated CPS 120 INEL diffractometer operating at 40 kV and 20 mA (Cu Kα radiation λ=1.5418 Å). The powder XRD pattern was recorded using the Windif data acquisition program. One chunk with a naturally cleaved surface was selected, and then mounted onto the sample holder of PXRD instrument. The XRD pattern was collected from the cleaved surface in the Si-calibrated CPS 120 INEL diffractometer as well. The orientation of a naturally cleaved surface of the crystal was directly determined by XRD to be the (001) direction, indicating that [Sn$_2$I$_5$]$^-$ layers were parallel to the growth direction.

Single Crystal X-Ray Diffraction. Single-crystal X-ray diffraction was performed at 298(2) K with a Stoe image-plate diffraction system (IPDS) II diffractometer using graphite-monochromated Mo Kα radiation (λ=0.71073 Å). Data reduction and numerical absorption corrections were done on the structures using Stoe X-Area software. Structures were solved by direct methods and refined by full-matrix least-squares on F$^2$ (all data) using the SHELXTL software suite. (See, Sheldrick, G. A short history of SHELX. *Acta Crystallogr. Sect. A* 2008, 64, 112-122.) Thermal displacement parameters were refined anisotropically for all atomic positions.

Thermal Analysis. To assess the thermal stability of TlSn$_2$I$_5$, differential thermal analysis (DTA) was performed using a Shimadzu DTA-50 thermogravimetric analyzer. Ground crystalline material (~30 mg) was flame sealed in a silica ampoule evacuated to 10$^{-4}$ mbar. As a reference, a similarly sealed ampoule of ~30 mg of Al$_2$O$_3$ was used. Samples were heated to ~400° C. at 5° C./min and then cooled at 5° C./min to ~20° C.

Mechanical Property Assessment. The Vickers hardness tests were performed on a Struers Duramin 5 automated micro hardness test instrument. The Vickers hardness test method consists of indenting the test material with a diamond indenter, in the form of a right pyramid with a square base and an angle of 136 degrees between opposite faces subjected to a load of 0.01 kgf. The full load is applied on the surface of fine polished wafer for 5 s. The two diagonals of the indentation left in the surface of the material after removal of the load are measured using a built-in microscope, and their average is calculated. Therefore, the area of the sloping surface of the indentation is estimated. As shown in Function 2, the Vickers hardness is the quotient obtained by dividing the kgf load by the square mm area of indentation:

$$HV = \frac{2F\sin\frac{136°}{2}}{d^2} \quad (2)$$

where F is the load in kgf, and d is the arithmetic mean of the two diagonals, d1 and d2, in mm. Three indents from different locations were obtained for measurements.

Optical Properties Measurements. Solid-state diffuse reflectance UV-vis-Near IR spectroscopy was performed with a Shimadzu UV-3600PC double-beam, double-monochromator spectrophotometer operating in the 200-2500 nm region using BaSO$_4$ as the 100% reflectance reference.

Band Structure Calculations. First-principles electronic structure calculations were carried out within the density functional theory formalism using the Projector Augmented Wave method implemented in the Vienna Ab-initio Simulation Package. (See, Blöchl, P. E. Projector augmented-wave method. *Physical Review B* 1994, 50, 17953-17979; Kresse, G., et al. Ab initio molecular-dynamics simulation of the liquid-metal-amorphous-semiconductor transition in germanium. *Phys. Rev. B* 1994, 49, 14251-14269; and Kresse, G., et al. Efficient iterative schemes for ab initio total-energy calculations using a plane-wave basis set. *Phys. Rev. B* 1996, 54, 11169-11186.) The energy cut-off for plane wave basis was set to 350 eV, and 7×7×7 k-point mesh was chosen for Brillouin zone (BZ) sampling. For exchange-correlation function, the generalized gradient approximation (GGA) was employed within Perdew-Burke-Ernzerhof (PBE) formalism. (See, Perdew, J. P.; Burke, K.; Ernzerhof, M. Generalized gradient approximation made simple. *Phys. Rev. Lett.* 1996, 77, 3865-3868.)

Device Fabrication and X-Ray Photocurrent Measurements. The sample was mounted on a 1-square-inch glass substrate. The contacts were fabricated by applying fast-dry carbon paint purchased from TED Pella. The diameter of the electrode on the top of sample was around 2 mm, while the whole area of the bottom of sample was covered by the fast-dry carbon paint for bottom electrode parallel to the top electrode. Cu wires were attached to the contacts made by carbon paint, and then attached to Cu foil attached to the glass substrate. The thickness of the device was around 1.0 mm, and the area was about 5 mm×9 mm. The DC I-V measurements under dark were performed. DC conductivity was measured using a Keithley 6517B electrometer and a Keithley 6105 resistivity adapter. Electromagnetic interface and photoconductive responses were eliminated by a metallic enclosure. In order to estimate mobility-lifetime products for carriers, photocurrent measurements were performed using 22 keV Ag X-ray as an irradiation source. Ag X-ray was generated from an CPS 120 INEL diffractometer operating at 40 kV and 2 mA. The single-carrier Hecht equation was adopted to determine the mobility-lifetime product for electrons, based on X-ray photocurrent measurements. (See, Hecht, K. Zum Mechanismus des lichtelektrischen primärstromes in isolierenden kristallen. *Z. Phys.* 1932, 77, 235-245.) The single-carrier Hecht equation is:

$$I = \frac{I_0 \mu \tau V}{L^2}\left(1 - e^{-\frac{L^2}{\mu\tau V}}\right) \quad (3)$$

where $I_0$ is the saturated photocurrent, and L (0.1 cm) is the thickness of detector.

Hard Radiation Spectroscopy Measurements. 122 keV γ-ray spectroscopy measurements were carried out in the atmosphere, and the distance between the $^{57}$Co radiation source (0.2 mCi) and the detector was set to 5 cm. The fabricated device was connected to an eV-550 preamplifier box. Various bias voltages from 100 V to 700 V were applied. The signals were transferred to an ORTEC amplifier (Model 572A) with a gain of 500, shaping time of 0.5 μs, and collection time of 180 s before they were evaluated by a dual 16 K input multichannel analyzer (Model ASPEC-927) and read into the MAESTRO-32 software. The linear amplifier gain, amplifier shaping time and the recorded time were 500, 0.5 μs and 180 s, respectively. An un-collimated $^{241}$Am alpha source was used to characterize the detector radiation response upon 5.5 MeV alpha particles. The activity of the alpha source was around 1.0 μCi. The measurements were also carried out in the atmosphere with a source-detector distance of 4 mm. The linear amplifier gain, amplifier shaping time and the recorded time were 100, 2.0 μs and 500 s, respectively. The single-carrier Hecht equation was adopted to determine the mobility-lifetime product for electrons as well, based on γ-ray spectroscopy measurements. The single-carrier Hecht equation is:

$$CCE(V) = \frac{Ch(V)}{\text{Constant}} = \frac{\mu\tau V}{L^2}\left(1 - e^{-\frac{L^2}{\mu\tau V}}\right) \qquad (4)$$

where CCE(V) is the charge collection efficiency at certain bias applied, Ch(V) is the peak channel number at certain bias applied, and L (0.1 cm) is the thickness of detector. The $\mu_r\tau_e$ and the constant can be derived from the experimental data of CCE(V) and Ch(V). Since there was no photopeak in the spectra, the maximum channel positions, instead of the peak channel numbers, were used to fit the single-carrier Hecht equation.

The methods described in this Example also can be used to make detector-grade materials comprising the other inorganic semiconductor compounds having the formula $AB_2X_5$ by substituting the appropriate precursors. By way of illustration, examples of suitable precursor for different $AB_2X_5$ compounds are listed below.

For $TlSn_2I_5$:
(1) Tl+I$_2$+Sn (stoichiometric amounts)
(2) TlI+SnI$_2$ (stoichiometric amounts)
(3) SnI$_2$+Tl+I$_2$ (stoichiometric amounts)

For $InSn_2I_5$:
(1) InI+SnI$_2$ (stoichiometric amounts)
(2) In+Sn+I$_2$ (stoichiometric amounts)
(3) In+SnI$_2$+I$_2$ (stoichiometric amounts)
(4) InI+Sn+I$_2$ (stoichiometric amounts)

For $TlSn_2Br_5$:
(1) TlBr+SnBr$_2$ (stoichiometric amounts)
(2) Tl+Sn+Br$_2$ (stoichiometric amounts)
(3) Tl+SnI$_2$+Br$_2$ (stoichiometric amounts)
(4) TlI+Sn+B$_2$ (stoichiometric amounts)

For $InSn_2Br_5$:
(1) InBr+SnBr$_2$ (stoichiometric amounts)
(2) In+Sn+Br$_2$ (stoichiometric amounts)
(3) In+SnBr$_2$+Br$_2$ (stoichiometric amounts)
(4) InBr+Sn+Br$_2$ (stoichiometric amounts)

For $TlPb_2I_5$:
(1) TlI+PbI$_2$ (stoichiometric amounts)
(2) Tl+Pb+I$_2$ (stoichiometric amounts)
(3) Tl+PbI$_2$+I$_2$ (stoichiometric amounts)
(4) TlI+Pb+I$_2$ (stoichiometric amounts)

For $TlPb_2Br_5$:
(1) PbBr+PbBr$_2$ (stoichiometric amounts)
(2) Tl+Pb+Br$_2$ (stoichiometric amounts)
(3) Tl+PbBr$_2$+Br$_2$ (stoichiometric amounts)
(4) TlBr+Pb+Br$_2$ (stoichiometric amounts)

For $InSn_2Br_5$:
(1) InBr+SnBr$_2$ (stoichiometric amounts)
(2) In+Sn+Br$_2$ (stoichiometric amounts)
(3) In+SnI$_2$+Br$_2$ (stoichiometric amounts)
(4) InI+Sn+Br$_2$ (stoichiometric amounts)

For $InPb_2I_5$:
(1) InI+PbI$_2$ (stoichiometric amounts)
(2) In+Pb+I$_2$ (stoichiometric amounts)
(3) In+PbI$_2$+I$_2$ (stoichiometric amounts)
(4) InI+Pb+I$_2$ (stoichiometric amounts)

For $InPb_2Br_5$:
(1) InBr+PbBr$_2$ (stoichiometric amounts)
(2) In+Pb+Br$_2$ (stoichiometric amounts)
(3) In+PbBr$_2$+Br$_2$ (stoichiometric amounts)
(4) InBr+Pb+Br$_2$ (stoichiometric amounts).

The word "illustrative" is used herein to mean serving as an example, instance, or illustration. Any aspect or design described herein as "illustrative" is not necessarily to be construed as preferred or advantageous over other aspects or designs. Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for detecting incident radiation, the method comprising:
   exposing a material comprising an inorganic semiconductor having the formula $AB_2X_5$, where A represents In, B represents Sn, Pb, or a combination thereof, and X represents Br, I, or a combination thereof, to incident gamma radiation, x-ray radiation, alpha particle radiation, or a combination thereof, wherein the material absorbs the incident radiation and electron-hole pairs are generated in the material; and
   measuring at least one of the energy or intensity of the absorbed incident radiation by detecting the generated electrons, holes, or both.

2. A method for detecting incident radiation, the method comprising:
   exposing a material comprising an inorganic semiconductor having the formula $AB_2X_5$, where A represents Tl, In, or a combination thereof, B represents Sn, and X represents Br, I, or a combination thereof, to incident gamma radiation, x-ray radiation, alpha particle radiation, or a combination thereof, wherein the material absorbs the incident radiation and electron-hole pairs are generated in the material; and
   measuring at least one of the energy or intensity of the absorbed incident radiation by detecting the generated electrons, holes, or both.

3. The method of claim 2, wherein the inorganic semiconductor has the formula $TlSn_2I_5$.

4. A device for the detection of incident radiation comprising:
   a material comprising an inorganic semiconductor having the formula $AB_2X_5$ or solid solution having the formula $AB_2X_5$, where A represents In, B represents Sn, Pb, or a combination thereof, and X represents Br, I, or a combination thereof;

a first electrode in electrical communication with the material;

a second electrode in electrical communication with the material, wherein the first and second electrodes are configured to apply an electric field across the material; and a detector configured to measure a signal generated by electron-hole pairs that are formed when the material is exposed to incident gamma radiation, x-ray radiation, alpha particle radiation, or a combination thereof.

5. A device for the detection of incident radiation comprising:

a material comprising an inorganic semiconductor having the formula $AB_2X_5$ or solid solution having the formula $AB_2X_5$, where A represents Tl, In, or a combination thereof, B represents Sn, and X represents Br, I, or a combination thereof;

a first electrode in electrical communication with the material;

a second electrode in electrical communication with the material, wherein the first and second electrodes are configured to apply an electric field across the material; and a detector configured to measure a signal generated by electron-hole pairs that are formed when the material is exposed to incident gamma radiation, x-ray radiation, alpha particle radiation, or a combination thereof.

6. The device of claim 5, wherein the inorganic semiconductor is $TlSn_2I_5$.

\* \* \* \* \*